(12) United States Patent
Tsukamoto

(10) Patent No.: US 6,473,020 B2
(45) Date of Patent: Oct. 29, 2002

(54) D/A CONVERSION APPARATUS WITH DIVIDED VOLTAGE SELECTING UNIT

(75) Inventor: Sanroku Tsukamoto, Berkshire (GB)

(73) Assignee: Fujitsu Limited, Kanagawa (JP)

( * ) Notice: Subject to any disclaimer, the term of this patent is extended or adjusted under 35 U.S.C. 154(b) by 0 days.

(21) Appl. No.: 09/813,959

(22) Filed: Mar. 22, 2001

(65) Prior Publication Data
US 2002/0050938 A1 May 2, 2002

(30) Foreign Application Priority Data
Oct. 31, 2000 (JP) ........................................ 2000-333142

(51) Int. Cl.[7] ............................ H03M 1/66; H03M 1/78
(52) U.S. Cl. ........................................ 341/154; 341/150
(58) Field of Search ............................... 341/119, 134, 341/144, 145, 150, 154, 120, 133; 323/313

(56) References Cited

U.S. PATENT DOCUMENTS

| | | | | |
|---|---|---|---|---|
| 4,338,591 A | * | 7/1982 | Tuthill | 341/145 |
| 4,800,365 A | * | 1/1989 | White et al. | 341/119 |
| 5,448,238 A | * | 9/1995 | White | 341/134 |
| 5,818,377 A | | 10/1998 | Wieser | |
| 6,118,262 A | * | 9/2000 | Suzuki | 323/313 |

FOREIGN PATENT DOCUMENTS

| | | |
|---|---|---|
| DE | 19748272 A1 | 12/1998 |
| JP | 2000183747 | 6/2000 |

OTHER PUBLICATIONS

Office Action of corresponding German Patent Application together with English translation. JP Abstract to JP 2000–183747 A and DE 197 48 272 A1 are cited in the German Office Action.

* cited by examiner

*Primary Examiner*—Patrick Wamsley
(74) *Attorney, Agent, or Firm*—Arent Fox Kintner Plotkin & Kahn

(57) ABSTRACT

In a D/A conversion apparatus capable of achieving high accuracy formation of output voltage of an analog signal, when data D7 through D0 of 8 bits are inputted to a decoder 4, by a control signal from the decoder 4, a pair of switches connected to both ends of predetermined resistor R0 are selected from respective switches S0A through S255A, S0B through S255B of respective switch groups 3A, 3B of a voltage selecting circuit 3 and simultaneously operated to make ON and the other respective switches are operated to make OFF. Further, voltage across both sides of resistor R0 of a voltage generating circuit 2 connected with the pair of switches operated to make ON is inputted to a differential amplifier 5 and average voltage of the voltage across the both ends of the resistor R0 connected with the switches operated to make ON is outputted from an output terminal 6 as an analog signal.

17 Claims, 8 Drawing Sheets

OUTLINE CONSTITUTION OF A D/A CONVERSION APPARATUS ACCORDING TO FIRST EMBODIMENT

DIAGRAM OF A CONVENTIONAL D/A CONVERSION APPARATUS

OUTLINE CONSTITUTION OF A D/A CONVERSION APPARATUS ACCORDING TO FIRST EMBODIMENT

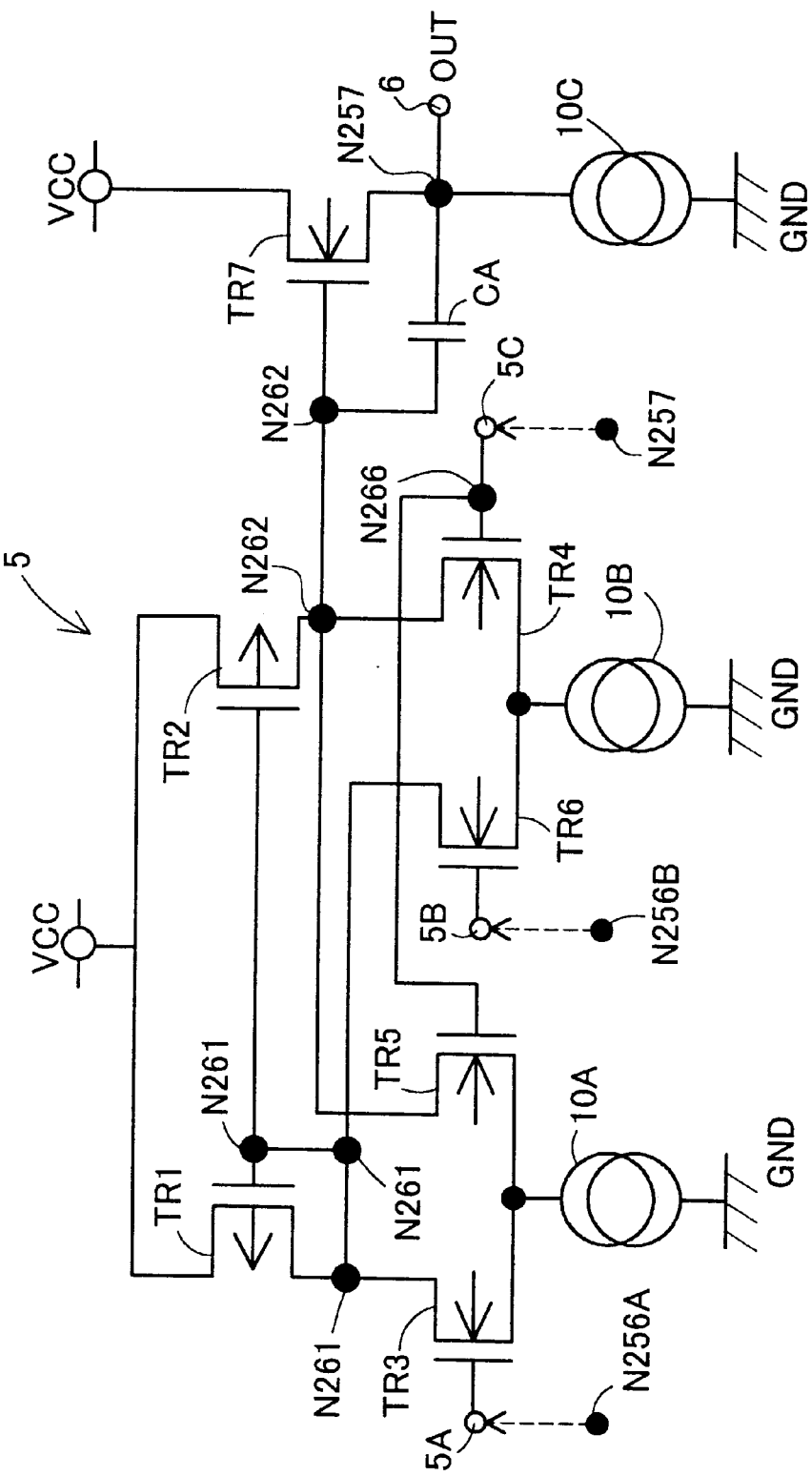
FIG. 3 CIRCUIT CONSTITUTION OF A DIFFERENTIAL AMPLIFIER ACCORDING TO FIRST EMBODIMENT

FIG. 4 SWITCH OPERATION TABLE OF VOLTAGE SELECTION CIRCUIT ACCORDING TO FIRST EMBODIMENT

| SIGNAL / SWITCH | 0 | 1 | 2 | 3 | ... | n | n+1 | ... | 254 | 255 |
|---|---|---|---|---|---|---|---|---|---|---|
| S255A | 0 | 0 | 0 | 0 | | 0 | 0 | | 0 | 1 |
| S254A | 0 | 0 | 0 | 0 | | 0 | 0 | | 1 | 0 |
| ... | | | | | | | | | | |
| Sn+1A | 0 | 0 | 0 | 0 | | 0 | 1 | | 0 | 0 |
| SnA | 0 | 0 | 0 | 0 | | 1 | 0 | | 0 | 0 |
| ... | | | | | | | | | | |
| S3A | 0 | 0 | 0 | 1 | | 0 | 0 | | 0 | 0 |
| S2A | 0 | 0 | 1 | 0 | | 0 | 0 | | 0 | 0 |
| S1A | 0 | 1 | 0 | 0 | | 0 | 0 | | 0 | 0 |
| S0A | 1 | 0 | 0 | 0 | | 0 | 0 | | 0 | 0 |
| S255B | 0 | 0 | 0 | 0 | | 0 | 0 | | 0 | 1 |
| S254B | 0 | 0 | 0 | 0 | | 0 | 0 | | 1 | 0 |
| ... | | | | | | | | | | |
| Sn+1B | 0 | 0 | 0 | 0 | | 0 | 1 | | 0 | 0 |
| SnB | 0 | 0 | 0 | 0 | | 1 | 0 | | 0 | 0 |
| ... | | | | | | | | | | |
| S3B | 0 | 0 | 0 | 1 | | 0 | 0 | | 0 | 0 |
| S2B | 0 | 0 | 1 | 0 | | 0 | 0 | | 0 | 0 |
| S1B | 0 | 1 | 0 | 0 | | 0 | 0 | | 0 | 0 |
| S0B | 1 | 0 | 0 | 0 | | 0 | 0 | | 0 | 0 |

1 : ON , 0 : OFF

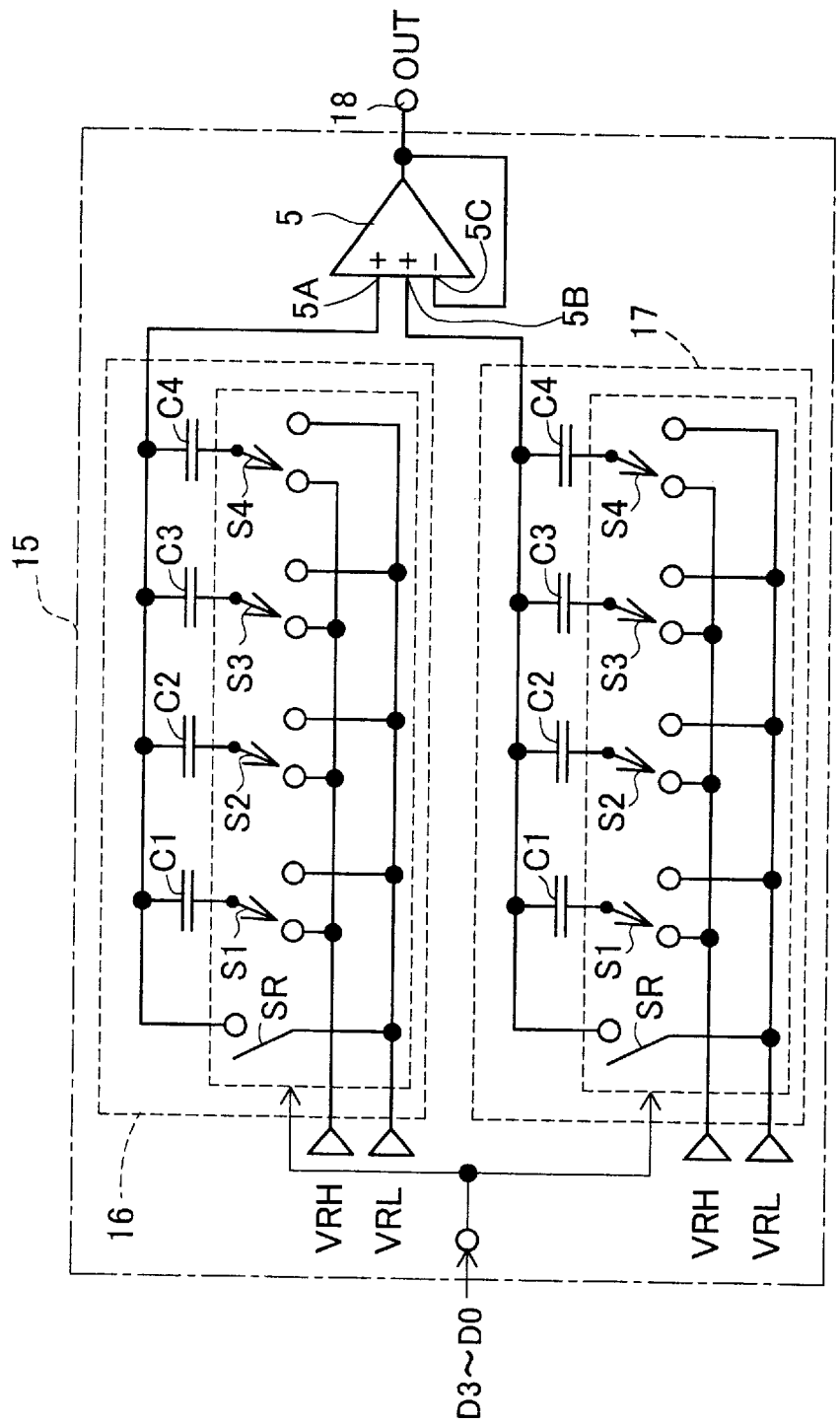
FIG. 5  OUTLINE CONSTITUTION OF A D/A CONVERSION APPARATUS ACCORDING TO SECOND EMBODIMENT

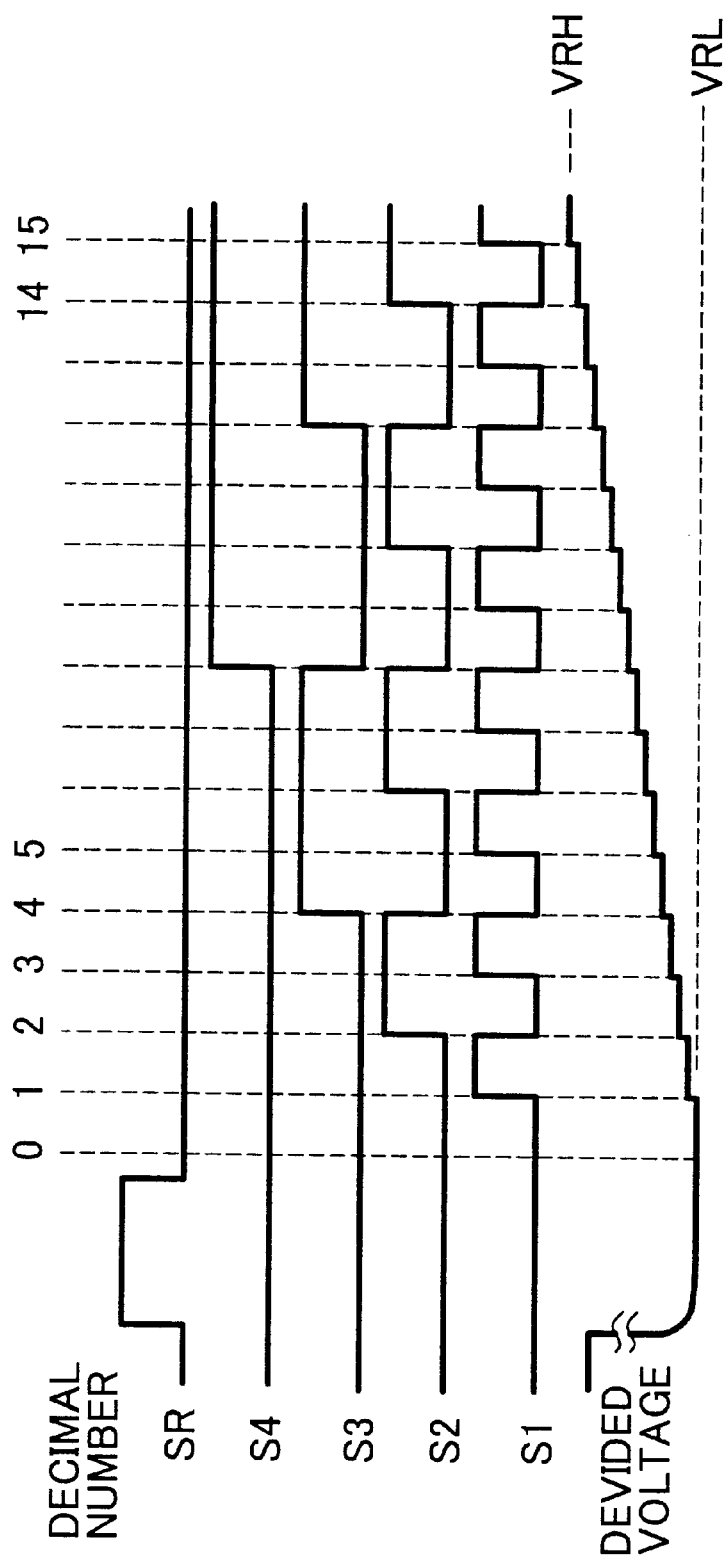
FIG. 6 OPERATION OF A FIRST VOLTAGE SHIFTING CIRCUIT ACCORDING TO SECOND EMBODIMENT AND DIVIDED VOLTAGE OUTPUTTED FROM THE FIRST SHIFTING CIRCUIT

FIG. 7 ANOTHER SWITCH OPERATION TABLE OF VOLTAGE SELECTION CIRCUIT ACCORDING TO FIRST EMBODIMENT

| SWITCH \ SIGNAL | 0 | 1 | 2 | 3 | ... | n | n+1 | ... | 254 | 255 |
|---|---|---|---|---|---|---|---|---|---|---|
| S255A | 0 | 0 | 0 | 0 | | 0 | 0 | | 0 | 1 |
| S254A | 0 | 0 | 0 | 0 | | 0 | 0 | | 1 | 0 |
| ... | | | | | | | | | | |
| Sn+2A | 0 | 0 | 0 | 0 | | 0 | 1 | | 0 | 0 |
| Sn+1A | 0 | 0 | 0 | 0 | | 1 | 0 | | 0 | 0 |
| ... | | | | | | | | | | |
| S4A | 0 | 0 | 0 | 1 | | 0 | 0 | | 0 | 0 |
| S3A | 0 | 0 | 1 | 0 | | 0 | 0 | | 0 | 0 |
| S2A | 0 | 1 | 0 | 0 | | 0 | 0 | | 0 | 0 |
| S1A | 1 | 0 | 0 | 0 | | 0 | 0 | | 0 | 0 |

1 : ON , 0 : OFF

FIG. 8

STILL ANOTHER SWITCH OPERATION TABLE OF VOLTAGE SELECTION CIRCUIT ACCORDING TO FIRST EMBODIMENT

| SIGNAL / SWITCH | 0 | 1 | 2 | 3 | ... | n | n+1 | ... | 254 | 255 |
|---|---|---|---|---|---|---|---|---|---|---|
| S255A / S252B | 0 | 0 | 0 | 0 | | 0 | 0 | | 0 | 1 |
| S254A / S252B | 0 | 0 | 0 | 0 | | 0 | 0 | | 1 | 0 |
| ... | | | | | | | | | | |
| Sn+3A / Sn+1B | 0 | 0 | 0 | 0 | | 0 | 1 | | 0 | 0 |
| Sn+2A / SnB | 0 | 0 | 0 | 0 | | 1 | 0 | | 0 | 0 |
| ... | | | | | | | | | | |
| S5A / S3B | 0 | 0 | 0 | 1 | | 0 | 0 | | 0 | 0 |
| S4A / S2B | 0 | 0 | 1 | 0 | | 0 | 0 | | 0 | 0 |
| S3A / S1B | 0 | 1 | 0 | 0 | | 0 | 0 | | 0 | 0 |
| S2A / S0B | 1 | 0 | 0 | 0 | | 0 | 0 | | 0 | 0 |

1 : ON , 0 : OFF

D/A CONVERSION APPARATUS WITH DIVIDED VOLTAGE SELECTING UNIT

BACKGROUND OF THE INVENTION

1. Field of the Invention

The present invention relates to a D/A (digital/analog) conversion apparatus for converting a digital signal into an analog signal, particularly to a D/A conversion apparatus in which by generating output voltage of an analog signal by averaging a plurality of divided voltages selected in correspondence with a digital signal of the D/A conversion apparatus, error of the respective divided voltages caused by a dispersion in respective elements formed on a semiconductor chip, thereby, high accuracy formation of the output voltage of the analog signal can be achieved.

2. Description of Related Art

An explanation will be given of an example of a conventional D/A conversion apparatus in reference to FIG. 1.

FIG. 1 is a diagram showing an example of the conventional D/A conversion apparatus.

As shown by FIG. 1, the D/A conversion apparatus 100 is provided with a voltage generating circuit 101, a voltage selecting circuit 102, a decoder 103 and an amplifier 104. The respective circuits 101 through 104 are formed on one semiconductor chip.

Further, the voltage generating circuit 101 is constituted by a ladder resistor comprising 255 pieces of resistors R0 connected in series and resistors ½*R0 connected in series with both end portions of the resistors R0 and having a resistance value of a half of that of the resistor R0, and one end portion of the ladder resistor is supplied with reference power source voltage VR and other thereof is connected to the ground GND of the circuit. Further, from connection points among the respective resistors R0 and the resistors ½*R0, that is, nodes N0A through N255A, predetermined divided voltages V0 through V255 are respectively outputted. For example, divided voltage Vn outputted from node NnA at an n-th order from node N0A, is represented by $Vn=VR \times (n+0.5) \div 256$ (incidentally, n=0 through 255).

Further, the voltage selecting circuit 102 is provided with 256 pieces of respective switches S0 through S255 and the respective switches S0 through S255 are constituted by MOS transistors. The respective switches S0 through S255 are respectively connected to nodes N0A through N255A. Further, output terminals of the respective switches S0 through S255 are connected by a node N256A.

Further, the node N256A is connected to an input terminal of the amplifier 104. Further, output of the amplifier 104 is connected to an output terminal 105.

Further, the decoder 103 is inputted with digital signals D7 through D0 of 8 bits from outside. Further, the decoder 103 outputs a control signal based on digital signals D7 through D0 of 8 bits and any one of the respective switches S0 through S255 of the voltage selecting circuit 102 is made ON in response to the control signal.

In this way, the node N256A is connected with any one of the respective nodes N0A through N255A of the voltage generating circuit 101 via any switch which is intended to be made ON.

Further, voltage of the node N256A is outputted to the output terminal 105 via the amplifier 104. That is, the respective divided voltages V0 through V255 of the respective nodes N0A through N255A connected to the node N256A are connected to the output terminal 105 via the amplifier 104. Thereby, output voltage of an analog signal in correspondence with the digital signals D7 through D0 is outputted from the output terminal 105 of the D/A conversion apparatus.

However, according to the above-described conventional D/A conversion apparatus 100, the reference power source voltage VR is divided by the respective resistors R0 through ½*R0 and desired divided voltage can be selected, however, there is provided a dispersion in specific accuracy (error of shape and dimension in semiconductor fabrication process) in the respective resistors R0 through ½*R0. Further, electric potential divided by the resistors is outputted as the analog signal as it is and accordingly, even when error is caused by dispersion in the resistors, the error is outputted as it is. Therefore, accuracy of the D/A conversion apparatus cannot be achieved so far as relative accuracy of the resistor is not sufficiently ensured. Further, there is a correlation between a size of a resistor element and relative accuracy in a semiconductor apparatus the more the resistor element is miniaturized, the more difficult the relative accuracy is achieved. In other words, in order to achieve certain constant accuracy, there is needed the resistor element size equal to or larger than a certain value. The accuracy of the resistor element poses a problem in downsizing and high accuracy formation of the D/A conversion apparatus.

SUMMARY OF THE INVENTION

The present invention has been carried out in order to resolve the problem of the conventional technology and it is an object thereof to provide a D/A conversion apparatus capable of averaging error of respective divided voltages generated by a dispersion in respective elements formed on a semiconductor chip by averaging a plurality of divided voltages selected in correspondence with digital signals of the D/A conversion apparatus and generating output voltage of an analog signal and capable of achieving high accuracy formation of the output voltage of the analog signal.

In order to achieve the above-described object, according to one aspect of the present invention, there is provided a D/A conversion apparatus comprising divided voltage generating unit for generating divided voltages by dividing voltage of a reference power source, selecting signal outputting unit for outputting a selecting signal by decoding inputted digital signals, divided voltage selecting unit for selecting and outputting a plurality of the divided voltages in the divided voltages based on the selecting signal, and voltage outputting unit for outputting predetermined voltage based on the plural divided voltages outputted from the divided voltage selecting unit.

According to the D/A conversion apparatus, the divided voltages are generated from the reference power source via the divided voltage generating unit. Further, the selecting signal by decoding the inputted digital signals is inputted to the divided voltage selecting unit via the selecting signal outputting unit. Further, the divided voltage selecting unit selects the plural divided voltages from the divided voltages based on the selecting signal and outputting the plural divided voltages to the voltage outputting unit and the voltage outputting unit outputs predetermined voltage based on the plural divided voltages outputted from the divided voltage selecting unit.

Thereby, output voltage of an analog signal is generated from the plural divided voltages and therefore, error of the individual divided voltage caused by dispersion of the respective elements formed on a semiconductor chip can be averaged and high accuracy formation of the output voltage of the analog signal can be achieved.

Further, according to another aspect of the present invention, there is provided a D/A conversion apparatus comprising divided voltage generating unit for generating a plurality of divided voltages based on inputted digital signals, and voltage outputting unit inputted with the plural divided voltages for outputting an average value of the plural divided voltages.

The D/A conversion apparatus generates the plural divided voltages based on the digital signals inputted via the divided voltage generating unit. Further, voltage of an average value of the plural divided voltages is outputted via the voltage outputting unit.

Thereby, the voltage of the average value of the plural divided voltages is generated as output voltage of an analog signal in correspondence with the inputted digital signals and therefore, error of individual divided voltage caused by dispersion of respective elements formed on a semiconductor chip can be averaged and high accuracy formation of the output voltage of the analog signal can be achieved.

The above and further objects and novel features of the invention will more fully appear from following detailed description when the same is read in connection with the accompanying drawings. It is to be expressly understood, however, that the drawings are purpose of illustration only and not intended as a definition of the limits of the invention.

BRIEF DESCRIPTION OF THE DRAWINGS

The accompanying drawings, which are incorporated in and constitute a part of this specification illustrate an embodiment of the invention and, together with the description, serve to explain the objects, advantages and principles of the invention.

In the drawings,

FIG. 3 is a diagram showing a circuit constitution of a differential amplifier of the D/A conversion apparatus according to the first embodiment;

FIG. 4 illustrates a switch operation table showing an example of operation of respective switches of a voltage selecting circuit of the D/A conversion apparatus according to the first embodiment by a control signal from a decoder;

FIG. 5 is a diagram showing an outline constitution of a D/A conversion apparatus according to a second embodiment;

FIG. 6 is a diagram showing an example of operation of respective switch circuits of a first voltage shifting circuit according to the second embodiment and divided voltage outputted from the first voltage shifting circuit;

FIG. 7 illustrates another switch operation table showing other example of operation of the respective switches of the voltage selecting circuit of the D/A conversion apparatus according to the first embodiment by the control signal from the decoder; and FIG. 8 illustrates still another switch operation table showing other example of operation of the respective switches of the voltage selecting circuit of the D/A conversion apparatus according to the first embodiment by the control signal from the decoder.

DETAILED DESCRIPTION OF THE PREFERRED EMBODIMENTS

A detailed explanation will be given of a D/A conversion apparatus according to the present invention by implemented first and second embodiments in reference to the drawings as follows.

Figure 1:
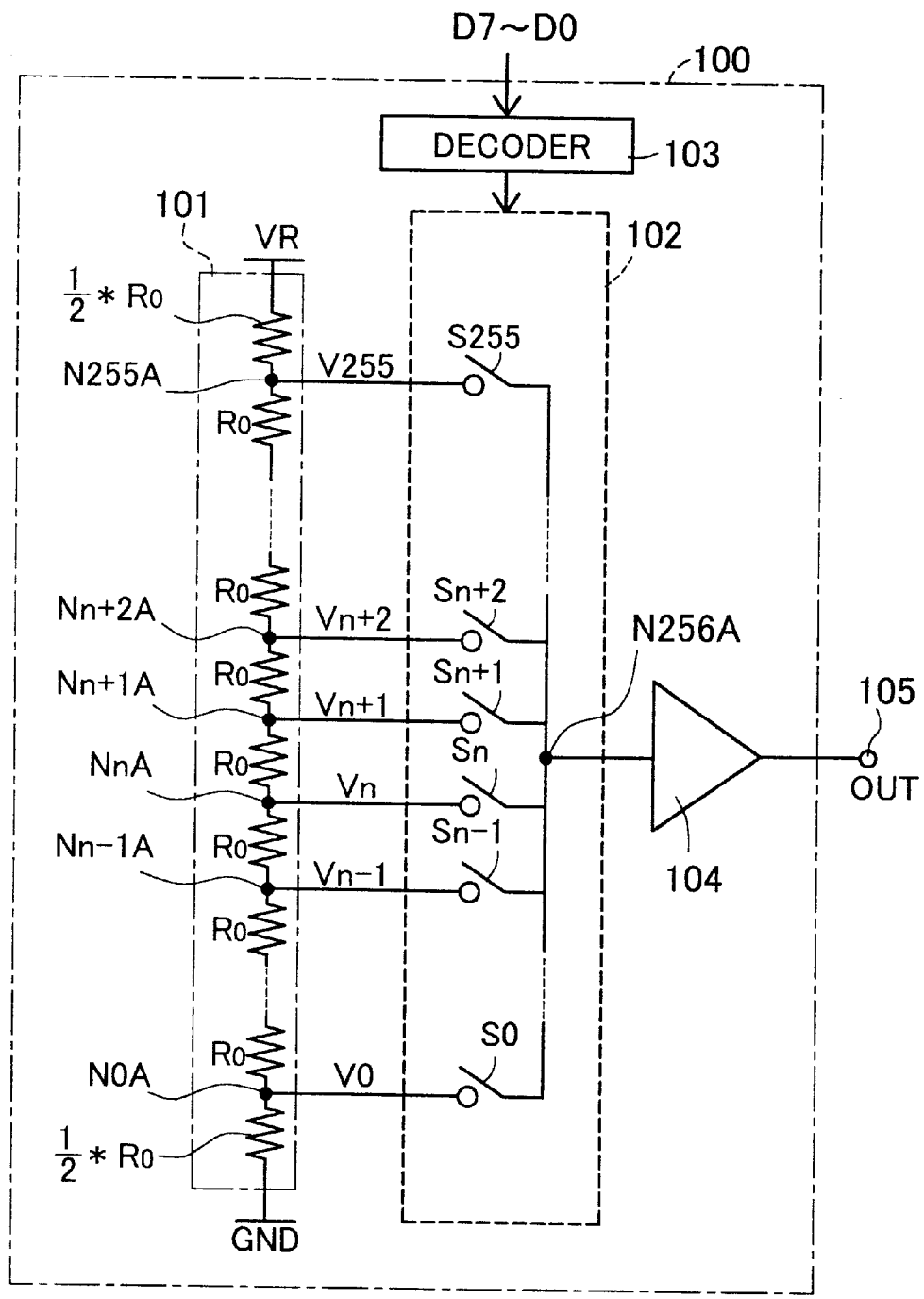
FIG. 1 is a diagram showing an example of a conventional D/A conversion apparatus.
Figure 2:
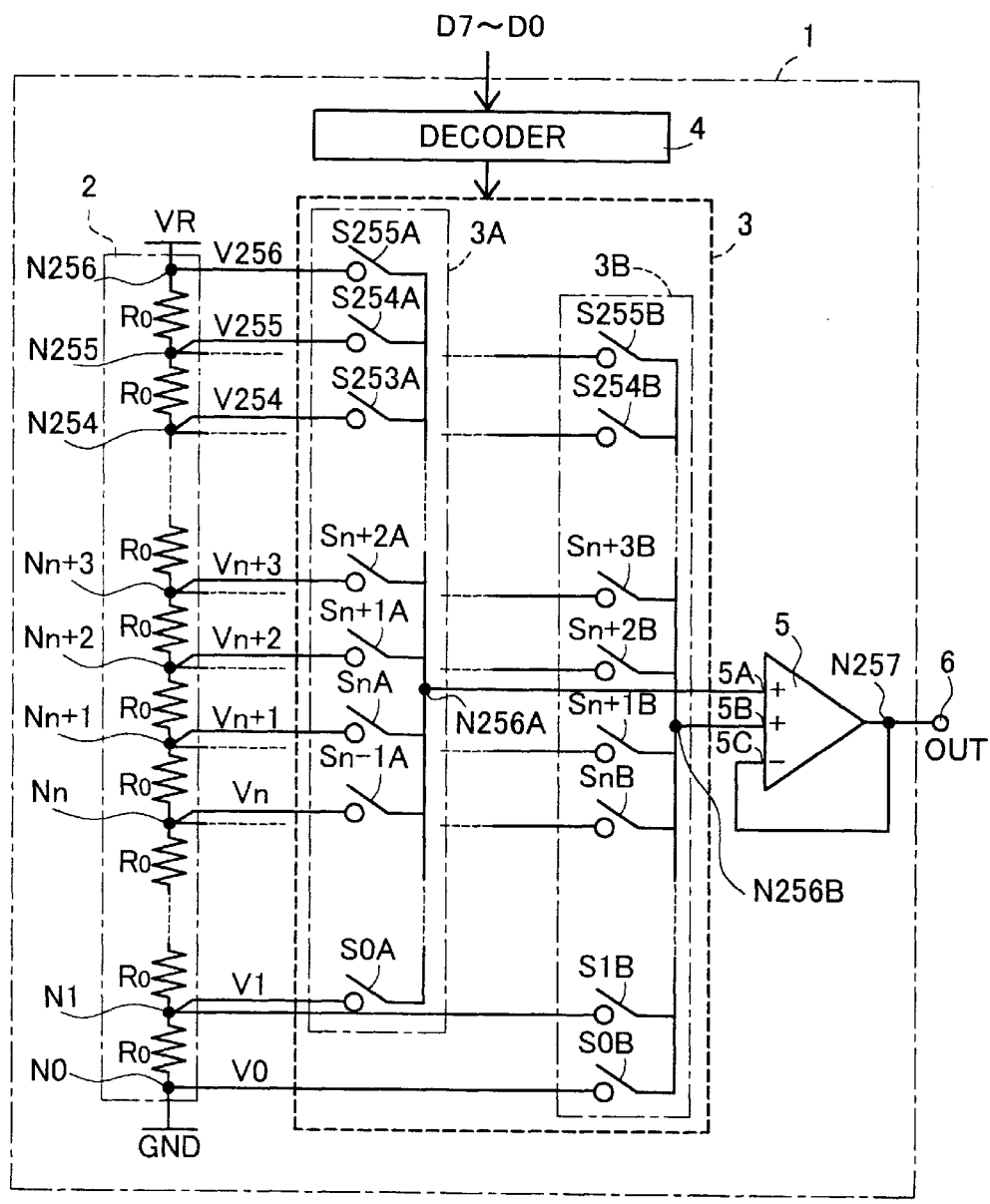
FIG. 2 is a diagram showing an outline constitution of a D/A conversion apparatus according to a first embodiment.

First, an explanation will be given of an outline constitution of the D/A conversion apparatus according to the first embodiment in reference to FIG. 2 and FIG. 3. FIG. 2 is a diagram showing the outline constitution of the D/A conversion apparatus according to the first embodiment. FIG. 3 is a diagram showing a circuit constitution of a differential amplifier of the D/A conversion apparatus according to the first embodiment.

As shown by FIG. 2, the D/A conversion apparatus 1 is provided with a voltage generating circuit 2, a voltage selecting circuit 3, a decoder 4 and a differential amplifier 5. The respective circuits 2 through 5 are formed on one semiconductor chip.

Further, the voltage generating circuit 2 is constituted by a ladder resistor by 256 pieces of resistors R0, one end thereof is supplied with reference power source voltage VR and the other end thereof is connected to the ground GND of the circuit. Further, from connection points at both ends of the ladder resistor and connection points of the respective resistors R0, that is, from respective nodes N0 through N256, divided voltages V0 through V256 produced by dividing the reference power source voltage VR by 257, are respectively outputted.

Further, the voltage selecting circuit 3 is constituted by a first switch group 3A of respective switches S0A through S255A and a second switch group 3B comprising 256 pieces of respective switches S0B through S255B. The respective switches S0A through S255A and S0B through S255B are constituted by MOS transistors and operate as selecting switches. Further, the respective switches S0A through S255A are connected to respective nodes N1 through N256 and the respective switches S0B through S255B are connected to respective nodes N0 through N255. Further, output terminals of the respective switches S0A through S255A are connected by a node N256A. Further, output terminals of the respective switches S0B through S255B are connected by a node N256B.

Further, the decoder 4 is inputted with digital signals D7 through D0 of 8 bits from outside. Further, the decoder 4 outputs a control signal based on the digital signals D7 through D0 of 8 bits and as described later, any one of the respective switches S0A through S255A and S0B through S255B constituting the respective switch groups 3A and 3B of the voltage selecting circuit 3 are made ON in response to the control signal (refer to FIG. 4).

In this way, the node N256A is connected with any one of the respective nodes N1 thorough N256 of the voltage generating circuit 2 via any switch which is intended to be made ON among the respective switches S0A through S255A of the first switch group 3A. Further, the node N256B is connected with any one of the respective nodes N0 through N255 of the voltage generating circuit 2 via any switch which is intended to be made ON among the respective switches S0B through S255B of the second switch group 3B.

Further, the respective nodes N256A and N256B are connected to respective noninverted input terminals (+)5A and 5B of the differential amplifier 5. Further, an output terminal N257 of the differential amplifier 5 is fed back to an inverted input terminal (−) 5C of the differential amplifier 5. Thereby, output voltage of an analog signal in correspondence with digital signals D7 through D0 is outputted from an output terminal 6 of the D/A conversion apparatus 1.

Next, an explanation will be given of a circuit constitution of the differential amplifier 5 in reference to FIG. 3. As shown by FIG. 3, the differential amplifier 5 is constituted by P-channel MOS transistors TR1 and TR2, N-channel MOS transistors TR3 through TR7, a capacitor element CA and current sources 10A through 10C. The respective P-channel MOS transistors TR1 and TR2 are formed to provide the same characteristic. Further, the respective N-channel MOS transistors TR3 through TR7 are formed to provide the same characteristic.

The sources of the respective P-channel MOS transistors TR1 and TR2 are connected to power source voltage VCC and the gates of the two P-channel MOS transistors TR1 and TR2 are connected to a node N261.

Further, the drain of the P-channel MOS transistor TR1 and the drain of the N-channel MOS transistor TR3 are connected to the node N261.

Further, the gate of the N-channel MOS transistor TR3 is connected to a node N256A via the noninverted input terminal 5A and the source of the transistor TR3 is connected to the ground GND via the constant current source 10A.

Further, the drain of the P-channel MOS transistor TR2 and the drain of the N-channel MOS transistor TR4 are connected to a node N262. Further, the gate of the N-channel MOS transistor TR4 is connected to a node N266. Further, the output terminal N257 (refer to FIG. 2) of the differential amplifier 5 is connected to a node N266 via the inverted input terminal 5C and the source of the transistor TR4 is connected to the ground GND via the constant current source 10B.

Further, the drain of the N-channel MOS transistor TR5 is connected to the node N262 and the gate of the transistor TR5 is connected to the node N266. Further, the source of the transistor TR5 is connected to the ground GND via the constant current source 10A.

Further, the drain of the N-channel MOS transistor TR6 is connected to the node N261 and the gate of the transistor TR6 is connected to the N256B (Refer to FIG. 2) via the noninverted input terminal 5B. Further, the source of the transistor TR6 is connected to the ground GND via the constant current source 10B.

Meanwhile, the drain of the N-channel MOS transistor TR7 is supplied with the power source voltage VCC and the gate of the transistor TR7 is connected to the node N262. Further, the source of the transistor TR7 is connected to a node N257. Further, the node 257 is connected with the node N262 via the capacitor element CA. Further, the node N257 is connected to the ground GND via the constant current source 10C. Further, the node N257 is connected to the output terminal 6 (refer to FIG. 2).

Thereby, the noninverted input terminals 5A and 5B of the respective differential amplifier pairs (transistors TR3 and TR5, transistors TR6 and TR4 are respectively inputted with voltages of the nodes N256A and N256B, meanwhile, the inverted input terminal 5C is fed back with voltage of the node N257 of the differential amplifier 5 and therefore, voltage of the node N257 becomes voltage of middle of voltage of the node N256A and voltage of the node N256B, that is, averaged voltage.

Here, the voltage generating circuit 2 functions as divided voltage generating unit. Further, decoder 4 functions as selecting signal outputting unit. Further, the voltage selecting circuit 3 functions as divided voltage selecting unit. Further, the differential amplifier 5 functions as voltage outputting unit and differential amplifier circuit. Further, the respective N-channel MOS transistors TR3 and TR5 and the respective N-channel MOS transistors TR4 and TR6, respec- tively constitute the differential amplifier pairs. Further, the respective N-channel MOS transistors TR3 and TR5 and the respective N-channel MOS transistors TR4 and TR6, respectively constitute differential pairs.

Next, an explanation will be given of operation of the respective switches S0A through S255A and S0B through S255B of the voltage selecting circuit 3 by a control signal from the decoder 4. FIG. 4 illustrates a switch operation table showing an example of operation of the respective switches S0A through S255A and S0B through S255B of the voltage selecting circuit 3 of the D/A conversion apparatus 1 according to the first embodiment by the control signal from the decoder 4.

As shown by FIG. 4, the switch operation table 11 is constituted by "signals" indicating control signals outputted from the decoder 4 in correspondence with data of 8 bits of D7 through D0 and "switches", indicating switches of the first switch group 3A and switches of the second switch group 3B which are made ON in correspondence with the "signals". Further, respective values "1" of the switch operation table 11 indicate that the switches are made ON and respective values "0" indicate that the switches are made OFF.

Further, "signals" of the switch operation table 11 are displayed with 256 of numerical values of "0", "1", "2", "3", ..., "n", "n+1", ..., "254" and "255" in correspondence with data D7 through D0 of 8b bits.

Further, "switches" in correspondence with the numerical values of the respective "signals", indicate respective pairs of switches of switches of the first switch group 3A and switches of the second switch group 3B which simultaneously carry out operation of ON/OFF. That is, the switch "S0A" of the first switch group 3A and the switch "S0B" of the second switch group 3B are simultaneously operated to make ON/OFF. Further, the switch "S1A" of the first switch group 3A and the switch "S1B" of the second switch group 3B are simultaneously operated to make ON/OFF. Further, the switch "S2A" of the first switch group 3A and the switch "S2B" of the second switch group 3B are simultaneously operated to make ON/OFF. Further, the switch "S3A" of the first switch group 3A and the switch "3B" of the second switch group 3B are simultaneously operated to make ON/OFF. Further, the switch "SnA" of the first switch group 3A and the switch "SnB" of the second switch group 3B are simultaneously operated to make ON/OFF. Further, the switch "Sn+1A" of the first switch group 3A and the switch "Sn+1B" of the second switch group 3B are simultaneously operated to make ON/OFF. Further, the switch "S254A" of the first switch group 3A and the switch "S254B" of the second switch group 3B are simultaneously operated to make ON/OFF. Further, the switch "S255A" of the first switch group 3A and the switch "255B" of the second switch group 3B are simultaneously operated to make ON/OFF.

Therefore, as shown by the switch operation table 11, when "0" is outputted as "signal" from the decoder 4 to the voltage selecting circuit 3, the respective switches S0A and S0B carry out ON operation and other respective switches S1A through S255A and S1B through S255B carry out OFF operation. Further, when "1" is outputted as "signal" from the decoder 4 to the voltage selecting circuit 3, the respective switches S1A and S1B carry out ON operation and other respective switches S0A, S2A through S255A, S0B, S2B through S255B carry out OFF operation. Further, when "2" is outputted as "signal" from the decoder 4 to the voltage selecting circuit 3, the respective switches S2A and S2B carry out ON operation and other respective switches S0A through S1A, S3A through S255A, S0B through S1B, S3B through S255B carry out OFF operation. Further, when "3" is outputted as "signal", from the decoder 4 to the voltage selecting circuit 3, the respective switches S3A and S3B carry out ON operation and other respective switches S0A through S2A, S4A through S255A, S0B through S2B, S4B through S255B carry out OFF operation. Further, when "n" is outputted as "signal" from the decoder 4 to the voltage selecting circuit, the respective switches SnA and SnB carry out ON operation and other respective switches S0A through Sn−1A, Sn+1A through S255A, S0B through Sn−1B, Sn+1B through S255B carry out OFF operation. Further, when "n+1" is outputted as "signal" from the decoder 4 to the voltage selecting circuit 3, the respective switches Sn+1A and Sn+1B carry out ON operation and other respective switches S0A through SnA, Sn+2A through S255A, S0B through SnB, Sn+2B through S255B carry out OFF operation. Further, when "254" is outputted as "signal" from the decoder 4 to the voltage selecting circuit 3, the respective switches S254A and S254B carry out ON operation and other respective switches S0A through S253A, S255A, S0B through S253B, S255B carry out OFF operation. Further, when "255" is outputted as "signal" from the decoder 4 to the voltage selecting circuit 3, the respective switches S255A and S255B carry out ON operation and other respective switches S0A through S254A, S0B through S254B carry out OFF operation.

Therefore, by "signal" in correspondence with data D7 through D0 of 8 bits from the decoder 4, a pair of switches in correspondence with the "signal" of the respective switch groups 3A and 3B of the voltage selecting circuit 3 are selected and simultaneously carry out ON operation and the other respective switches carry out OFF operation.

As has been explained in details, according to the D/A conversion apparatus 1 of the first embodiment, when data D7 through D0 of 8 bits are inputted to the decoder 4, by the control signal from the decoder 4, from the respective switches S0A through S255A, S0B through S255B of the respective switch groups 3A and 3B of the voltage selecting circuit 3, a pair of switches connected to both ends of a predetermined one of the R0 resistors are selected and carry out simultaneously ON operation and other respective switches carry out OFF operation. Further, voltage across both ends of the resistor R0 of the voltage generating circuit 2 connected with the pair of switches carrying out ON operation, is inputted to the differential amplifier 5 and average voltage of voltages across both ends of the resistor R0 connected with the switches carrying out ON operation, is outputted as an analog signal from the output terminal 6.

Therefore, a predetermined one of the resistors R0 is selected from the ladder resistor constituted by 256 pieces of the resistors R0 by the voltage selecting circuit 3 and voltage across both ends of the selected resistor R0 is outputted to the differential amplifier 5 and accordingly, even when error of divided voltage is caused by a dispersion in the respective resistors R0 formed on the semiconductor chip, the error of the individual divided voltage can be averaged and high accuracy formation of output voltage of the analog signal can be achieved.

Further, the respective transistors TR1 through TR6 constituting the differential amplifier 5 are formed to provide the same characteristic and accordingly, the average value of two divided voltages inputted to the differential amplifier 5 constitutes the output voltage of the analog signal, the error of the respective divided voltage can be averaged and high accuracy formation of output voltage of the analog signal can be achieved.

Further, the respective transistors TR1 through TR7 constituting the differential amplifier 5 are constituted by MOS transistors and accordingly, there can be realized the differential amplifier circuit having high accuracy without being influenced by the fabrication dispersion.

Next, an explanation will be given of a D/A conversion apparatus according to a second embodiment in reference to FIG. 5. FIG. 5 is a diagram showing an outline constitution of the D/A conversion apparatus according to the second embodiment.

As shown by FIG. 5, according to the D/A conversion apparatus 15 of the second embodiment, similar to the D/A conversions apparatus 1 according to the first embodiment, the respective noninverted input terminals (+) 5A and 5B of the differential amplifier 5 are inputted with respective voltages outputted from a first voltage shifting circuit 16 and a second voltage shifting circuit 17 and average voltage of the inputted divided voltages is outputted as an analog signal from the differential amplifier 5. Incidentally, data signals D3 through D0 of 4 bits are inputted from outside. Further, as described later, the D/A conversion apparatus 15 according to the second embodiment differs from the D/A conversion apparatus 1 according to the first embodiment in that the respective voltage shifting circuits 16 and 17 for generating the divided voltages are constituted by respective capacitor elements C1 through C4 respective reset switches SR and respective switch circuits S1 through S4. Further, notations the same as those in FIG. 5 designate the same or corresponding portions.

Here, since the first voltage shifting circuit 16 and the second voltage shifting circuit 17 are provided with the same circuit constitution, an explanation will be given of the circuit constitution of the first voltage shifting circuit 16.

According to the first voltage shifting circuit 16, one end sides of the first capacitor element C1, the second capacitor element C2, the third capacitor element C3 and the fourth capacitor element C4 are connected in parallel and other end sides of the respective capacitor elements C1, C2, C3 and C4 are connected with the respective switch circuits S1, S2, S3 and S4. Further, the one end sides of the respective capacitor elements C1, C2, C3 and C4 are connected to low reference potential VRL via the reset switch SR and connected to the noninverted input terminal (+) 5A of the differential amplifier 5. Further, the capacitance of the second capacitor element C2 is formed to be capacitance twice as much as capacitance of the first capacitor element C1. Further, the capacitance of the third capacitor element C3 is formed to be capacitance 4 times as much as capacitance of the first capacitor elemental. Further, the capacitance of the fourth capacitor element C4 is formed to be capacitance 8 times as much as capacitance of the first capacitor element C1.

Further, constitutions of the respective switch circuits S1, S2, S3 and S4 are the same and are formed to be connected to high reference potential VRH or low reference potential VRL as mentioned later by the digital signals D3 through D0 of 4 bits. Further, the reset switch SR is driven to ON/OFF by a reset signal in initializing and in the case of ON drive, the reset switch SR is connected to low reference potential VRL and in the case of OFF drive, the reset switch SR is shut off.

Next, an explanation will be given of operation of the respective switch circuits S1, S2, S3 and S4 of the first voltage shifting circuit 16 and divided voltage outputted from the first voltage shifting circuit 16 in reference to FIG. 6. FIG. 6 is a diagram showing an example of operation of the respective switch circuits S1, S2, S3 and S4 of the first voltage shifting circuit 16 according to the second embodiment and divided voltage outputted from the first voltage shifting circuit 16. Further, in starting the circuit, the respective switch circuits S1, S2, S3 and S4 connect other end sides of the respective capacitor elements C1, C2, C3 and C4 to low reference potential VRL. Further, in starting the circuit, the reset switch SR is driven to OFF. Further, operation of the respective switch circuits S1, S2, S3 and S4 of the second voltage shifting circuit 17 and divided voltage outputted from the second voltage shifting circuit 17 are the same as those of the first voltage shifting circuit 16.

As shown by FIG. 6, first, as an initializing signal before input of data D3 through D0 of 4 bits, the reset switch SR is driven to ON, the respective capacitor elements C1, C2, C3 and C4 are connected. to low reference potential VRL and remaining charge charged to the respective capacitor elements C1, C2, C3 and C4 is discharged. At this occasion, divided voltage outputted from the first voltage shifting circuit 16 is low reference potential VRL.

Next, the respective switch circuits S1, S2, S3 and S4 correspond in turn in an order of from lower bits to upper bits of inputted data D3 through D0 of 4 bits. Further, when values of the respective bits D3, D2, D1 and D0 are "1", a switch circuit in correspondence with the bit of "1" is connected to high reference potential VRH. Further, when values of respective bits D3, D2, D1 and D0 are "0", a switch circuit in correspondence with the bit of "0" is connected to low reference potential VRL.

For example, when data of 4 bits is "0000", that is, in the case of decimal "0", the respective switch circuits S1, S2, S3 and S4 are connected to low reference potential VRL. Further, when data of 4 bits is "0001", that is, in the case of decimal "1", the switch circuit S1 is connected to high reference potential VRH and the other circuits S2, S3 and S4 are connected to low reference potential VRL. Further, when data of 4 bits is "0010", that is, in the case of decimal "2", the switch circuit S2 is connected to high reference potential VRH and the other switch circuits S1, S3 and S4 are connected to low reference potential VRL. Further, when data of 4 bits is "0011", that is, in the case of decimal "3", the respective circuits S1 and S2 are connected to high reference potential VRH and the other switch circuits S3 and S4 are connected to low reference potential VRL. Further, when data of 4 bits is "0100", that is, in the case of decimal "4", the switch circuit S3 is connected to high reference potential VRH and the other switch circuits S1, S2 and S4 are connected to low reference potential VRL. Further, when data of 4 bits is "0101", that is, in the case of decimal "5", the respective switch circuits S1 and S3 are connected to high reference potential and the other switch circuits S2 and S4 are connected to low reference potential VRL. Further, when data of 4 bits is "0110", that is, in the case of decimal "6", the respective switch circuits S2 and S3 are connected to high reference potential VRH and the other switch circuits S1 and S4 are connected to low reference potential VRL. Further, when data of 4 bits is "0111", that is, in the case of decimal "7", the respective switch circuits S1, S2 and S3 are connected to high reference potential VRH and the other switch circuit S4 is connected to low reference potential VRL. Further, when data of 4 bits is "1000", that is, in the case of decimal "8", the switch circuit S4 is connected to high reference potential VRH and the other switch circuits S1, S2 and S3 are connected to low reference potential VRL. Further, when data of 4 bits is "1001", that is, in the case of decimal. "9", the respective switch circuits S1 and S4 are connected to high reference potential the VRH and the other switch circuits S2 and S3 are connected to low reference potential VRL. Further, when data of 4 bits is "1010", that is, in the case of decimal "10", the respective switch circuits S2 and S4 are connected to high reference potential VRH and the other switch circuits S1 and S3 are connected to low reference potential VRL. Further, when data of 4 bits is "1011", that is, in the case of decimal "11", the respective switch circuits S1, S2 and S4 are connected to high reference potential VRH and the other switch circuit S3 is connected to low reference potential VRL. Further, when data of 4 bits is "1100", that is, in the case of decimal "12", the respective switch circuits S3 and S4 are connected to high reference potential VRH and the other switch circuits S1 and S2 are connected to low reference potential VRL. Further, when data of 4 bits is "1101", that is, in the case of decimal "13", the respective switch circuits S1, S3 and S4 are connected to high reference potential VRH and the other switch circuit S2 is connected to low reference potential VRL. Further, when data of 4bits is "1110", that is, in the case of decimal "14", the respective switch circuits S2, S3 and S4 are connected to high reference potential VRH and the other switch circuit S1 is connected to low reference potential VRL. Further, when data of 4 bits is "1111", that is, in the case of decimal "15", the respective switch circuits S1, S2, S3 and S4 are connected to high reference potential VRH.

Successively, the respective switch circuits S1, S2, S3 and S4 are connected to low reference potential VRL. Thereby, total electric charge charged to respectives of the capacitor elements C1, C2, C3 and C4 is redistributed at equal potential to the respective capacitor elements C1, C2, C3 and C4. Further, the equal potential of the capacitor elements C1, C2, C3 and C4 after redistribution is outputted to the noninverted input terminal 5A.

For example, when data of 4 bits is "0000", that is, in the case of decimal "0", the noninverted input terminal 5A of the differential amplifier 5 is outputted with divided voltage of voltage V=low reference potential VRL. Further, when data of 4 bits is "0001", that is, in the case of decimal "1", the noninverted input terminal 5A of the differential amplifier 5 is outputted with divided voltage of voltage V=low reference potential VRL+(high reference potential VRH−low reference potential VRL)÷15×1. Further, when data of 4 bits is "0010", that is, in the case of decimal "2", the noninverted input terminal 5A of the differential amplifier 5 is outputted with divided voltage of voltage V=low reference potential VRL+(high reference potential VRH−low reference potential VRL)÷15×2. Further, when data of 4 bits is "0011", that is, in the case of decimal "3", the noninverted input terminal 5A of the differential amplifier 5 is outputted with divided voltage of voltage V=low reference potential VRL+(high reference potential VRH−low reference potential VRL)÷15×3. Further, when data of 4 bits is "0100", that is, in the case of decimal "4", the noninverted input terminal 5A of the differential amplifier 5 is outputted with divided voltage of voltage V=low reference potential VRL+(high reference potential VRH low−reference potential VRL)÷15×4. Further, when data of 4 bits is "0101", that is, in the case of decimal "5", the noninverted input terminal 5A of the differential amplifier 5 is outputted with divided voltage of voltage V=low reference potential VRL+(high reference potential VRH−low reference potential VRL)÷15×5. Further, when data of 4 bits is "0110", that is, in the case of decimal "6", the noninverted input terminal 5A of the differential amplifier 5 is outputted with divided voltage of voltage V=low reference potential VRL+(high reference potential VRH−low reference potential VRL)÷15×6. Further, when data of 4 bits is "0111", that is, in the case of decimal "7", the noninverted input terminal 5A of the differential amplifier 5 is outputted with divided voltage of voltage V=low reference potential VRL+(high reference potential VRH low reference potential VRL)÷15×7. Further, when data of 4 bits is "1000", that is, in the case of decimal "8", the noninverted input terminal 5A of the differential amplifier 5 is outputted with divided voltage of voltage V=low reference potential VRL+(high reference potential VRH–low reference potential VRL)÷15×8. Further, when data of 4 bits is "1001", that is, in the case of decimal "9", the noninverted input terminal 5A of the differential amplifier 5 is outputted with divided voltage of voltage V=low reference potential VRL+(high reference potential VRH× low reference potential VRL)÷15×9. Further, when data of 4 bits is "1010", that is, in the case of decimal "10", the noninverted input terminal 5A of the differential amplifier 5 is outputted with divided voltage of voltage V=low reference potential VRL+(high reference potential VRH low-reference potential VRL)÷15×10. Further, when data of 4 bits is "1011", that is, in the case of decimal "11", the noninverted input terminal 5A of the differential amplifier 5 is outputted with divided voltage of voltage V=low reference potential VRL+(high reference potential VRH–low reference potential VRL)÷15×11. Further, when data of 4 bits is "1100", that is, in the case of decimal "12", the noninverted input terminal 5A of the differential amplifier 5 is outputted with divided voltage of voltage V=low reference potential VRL+(high reference potential VRH–low reference potential VRL) ÷15×12. Further, when data of 4 bits is "1101", that is, in the case of decimal "13", the noninverted input terminal 5A of the differential amplifier 5 is outputted with divided voltage of voltage V=low reference potential VRL+(high reference potential VRH low–reference potential VRL)÷15×13. Further, when data of 4 bits is "1110", that is, in the case of decimal "14", the noninverted input terminal 5A of the differential amplifier 5 is outputted with divided voltage of voltage V=low reference potential VRL+(high reference potential VRH–low reference potential VRL)÷15×14. Further, when data of 4 bits is "1111", that is, in the case of decimal "15", the noninverted input terminal 5A of the differential amplifier 5 is outputted with divided voltage of voltage V=high reference potential VRH.

Further, the reset switch SR and the respective switch circuits S1, S2, S3 and S4 of the second voltage shifting circuit 17 are operated similar to the reset switch SR and the respective switch circuits S1, S2, S3 and S4 of the first voltage shifting circuit 16. Thereby, divided voltages of low reference potential VRL through high reference potential VRH are outputted from the second voltage shifting circuit 17 to the noninverted input terminal 5B of the differential amplifier 5 in correspondence with inputted data D3 through D0 of 4 bits (refer to FIG. 6).

Further, average voltage of divided voltages of the respective voltage shifting circuits 16 and 17 inputted to the respective noninverted input terminals 5A and 5B, is outputted from the differential amplifier 5 via an output terminal 18 as an analog signal similar to the first embodiment.

Here, the first voltage shifting circuit 16 and the second voltage shifting circuit 17 constitute divided voltage generating unit. Further, the respective switch circuits S1 through S4 function as divided voltage selecting unit. Further, the differential amplifier 5 functions as voltage outputting unit and differential amplifier circuit. Further, the respective N-channel MOS transistors TR3 and TR5 and the respective N-channel MOS transistors TR4 and TR6 respectively constitute differential amplifier pairs. Further, the respective N-channel MOS transistors TR3 and TR5 and the respective N-channel MOS transistors TR4 and TR6 respectively constitute differential pairs.

As has been explained in details, in the case of the D/A conversion apparatus 15 according to the second embodiment, according to the respective switch circuits S1, S2, S3 and S4, in starting the circuit, the other end sides of the respective capacitor elements C1, C2, C3 and C4 one end sides of which are connected in parallel, are connected to low reference potential VRL. Further, in starting the circuit, the reset switch SR is driven to make OFF. Further, in the initializing operation, the reset switch SR is driven to make ON and the respective capacitor elements C1, C2, C3 and C4 are discharged to low reference potential VRL. Next, according to the respective switch circuits S1 through S4, when respective corresponding bit data of 4 bits is/are 1, the corresponding switch is/are connected to high reference potential VRH to thereby charge the capacitors. Next, the respective switch circuits S1 through S4 are connected to low reference potential VRL and total electric charge of the respective capacitor elements C1 through C4 is redistributed to the respective capacitor elements C1 through C4 at equal potential. Further, the equal potential of the respective voltage shifting circuits 16 and 17 is inputted to the respective noninverted input terminal 5A and 5B of the differential amplifier 5 and average voltage of the respective voltage shifting circuits 16 and 17 are outputted from the output terminal 18 as the analog signal.

Therefore, after the total electric charge of the respective capacitor elements C1 through C4 of the respective voltage shifting circuits 16 and 17 has been redistributed to the capacitor elements C1 through C4 at equal potential, the equal potential of the respective voltage shifting circuits 16 and 17 is inputted to the respective noninverted input terminals 5A and 5B of the differential amplifier 5 and accordingly, even when error of divided voltage is caused by the dispersion in the respective capacitor elements C1 through C4 formed in the semiconductor chip, the error of the individual divided voltage can be averaged and higher accuracy formation of output voltage of the analog signal can be achieved.

Further, the respective transistors TR1 through TR6 constituting the differential amplifier 5 are formed to provide the same characteristic and accordingly, the average value of two of the divided voltages inputted to the differential amplifier 5 becomes the output voltage of the analog signal, the error of the respective divided voltage can be averaged and high accuracy formation of the output voltage of the analog signal can be achieved.

Further, the respective transistors TR1 through TR7 constituting the differential amplifier 5 are constituted by MOS transistors and accordingly, there can be realized the differential amplifier circuit having high accuracy without being influenced by the fabrication dispersion.

Further, the present invention is not limited to the above-described embodiments but can be improved or modified variously in a range not deviated from the gist of the present invention. For example, the present invention may be as follows.

(a) Although according to the first embodiment, voltage across both ends of the respective resistor R0 is selected by the voltage selecting circuit 3, there may be constructed a constitution in which as shown by FIG. 7, voltage across both ends of 2 pieces of the resistors R0 connected in series or as shown by FIG. 8, voltage across both ends of 3 pieces of the resistors R0 connected in series, is selected and inputted to the respective noninverted input terminals 5A and 5B of the differential amplifier 5. Further, there may be constructed a constitution in which voltage across both ends of 4 pieces or more of the resistors connected in series, is selected and inputted to the respective noninverted input terminals 5A and 5B of the differential amplifier 5. FIG. 7 illustrates a switch operation table 21 showing another example of operation of the respective switches S0A through S255A and S0B through S255B of the voltage selecting circuit 3 of the D/A conversion apparatus 1 according to the first embodiment by the control signal from the decoder 4. FIG. 8 illustrates a switch operation table 22 showing other example of operation of the respective switches S0A through S255A and S0B through S255B of the voltage selecting circuit 3 of the D/A conversion apparatus 1 according to the first embodiment by the control signal from the decoder 4. Thereby, even when error of divided voltage is caused by the dispersion in the respective resistors R0 formed on the semiconductor chip, error of the individual divided voltage can be averaged and there can be achieved higher accuracy formation of output voltage of analog signal.

(b) Although according to the first embodiment, the voltage generating circuit 2 is constituted by a single piece of ladder resistor, there may be constructed a constitution in which 2 pieces of ladder resistors are formed and either one of the respective switch groups 3A and 3B is connected to one of the respective ladder resistors. Thereby, influence of relative accuracy among the respective resistors R0 can be reduced.

(c) Although according to the first embodiment, divided voltages at 2 locations of the voltage generating circuit 2 are averaged by the differential amplifier 5 and outputted, desired predetermined voltage can be outputted by proportionally distributing divided voltages at 3 locations or more by proportionally distributing unit. Further, when there is constructed a constitution in which the proportionally distributing unit is provided with a differential amplifier circuit inputted with divided voltages at 3 locations or more and the predetermined voltage is fed back, output voltage of an analog signal proportionally distributed at predetermined rates is generated. Thereby, error of the respective divided voltage generated by the dispersion of the respective element formed on the semiconductor chip can be-proportionally distributed by predetermined rates and there can be achieved high accuracy formation of the output voltage of the analog signal.

Further, when the differential amplifier circuit is constituted to include the plural differential amplifier pairs and is constructed by a constitution in which the differential amplifier pairs are provided with predetermined weighting for proportionally distributing divided voltages at 3 locations or more, the differential amplifier pairs are provided with the predetermined weighting and proportionally distributed with divided voltages at 3 locations or more. Thereby, the divided voltages can be proportionally distributed by providing the predetermined weighting. That is, error of the respective divided voltage can be proportionally distributed by providing the predetermined weighting, high accuracy formation of the output voltage of the analog signal is achieved and desired output voltage can be provided.

Further, when there is constructed a constitution in which divided voltages at 3 locations or more are averaged by setting predetermined weighting substantially by the same rate, an average value of the divided voltages at 3 locations or more becomes the output voltage of the analog signal and accordingly, error of the respective divided voltage can be averaged and there can be achieved high accuracy formation of the output voltage of the analog signal.

That is, voltage of an average value of a plurality of divided voltages is generated as output voltage of an analog signal in correspondence with inputted digital signals and therefore, error of individual divided voltage caused by dispersion in the respective elements formed on the semiconductor chip can be averaged and there can be achieved high accuracy formation of the output voltage of the analog signal. Further, voltage outputting unit is constituted by a plurality of differential pairs supplied with a plurality of divided voltages and predetermined voltage and therefore, there can be easily constituted an output circuit for averaging a predetermined divided voltages and outputting thereof.

(d) Although according to the second embodiment, equal potential of the respective capacitor elements C1 through C4 of 2 pieces of respective voltage shifting circuits 16 and 17 is averaged by the differential amplifier 5 and outputted, desired predetermined voltage can be outputted by forming 3 pieces or more of voltage shifting circuits and proportionally distributing equal potential of the respective capacitor elements by proportionally distributing unit. Further, when there is constructed a constitution in which the proportionally distributing unit is provided with a differential amplifier circuit inputted with 3 locations or more of divided voltages and predetermined voltage is fed back, output voltage of analog signal proportionally distributed at predetermined rate is generated. Thereby, error of respective divided voltage caused by the dispersion in the respective elements formed on the semiconductor chip can be proportionally distributed at predetermined rate and there can be achieved high accuracy formation of the output voltage of the analog signal.

Further, when there is constructed a constitution in which the differential amplifier circuit is constituted to provide a plurality of differential amplifier pairs and the differential amplifier pairs are provided with predetermined weighting for proportionally distributing 3 locations or more of divided voltages, the differential amplifier pairs are provided with predetermined weighting and 3 locations or more of divided voltages are proportionally distributed. Thereby, the predetermined weighting can be provided and distributed. That is, error of the respective divided voltage can be provided with predetermined weighting and distributed, there can be achieved high accuracy formation of the output voltage of the analog signal and desired output voltage can be provided.

Further, when there is constructed the constitution in which the predetermined weighting is made substantially the same rate and 3 locations or more of divided voltages are averaged, an average value of 3 locations or more of divided voltages becomes the output voltage of the analog signal and therefore, error of respective divided voltage can be averaged and high accuracy formation of the output voltage of the analog signal can be achieved.

That is, the voltage of the average value of the plural divided voltages is generated as the output voltage of the analog signal in correspondence with the inputted digital signal and accordingly, error of individual divided voltage generated by the dispersion in respective elements formed on the semiconductor chip can be averaged and high accuracy formation of the output signal of the analog signal can be achieved. Further, voltage outputting unit is constituted by a plurality of differential pairs supplied with a plurality of divided voltages and predetermined voltage and accordingly, there can be constructed easily an output circuit for averaging the plural divided voltages and outputting thereof.

(e) Although according to the first and the second embodiments, characteristics of the respective MOS transistors TR1 through TR6 constituting the differential amplifier 5 are made substantially the same, the same weighting is provided uniformly, the characteristics of the respective transistors TR1 through TR6 may be made to differ from each other and the predetermined weighting may be provided to the respective transistors. Thereby, voltage of the analog signal outputted from the differential amplifier 5 can be set to voltage at a desired rate of divided voltages inputted to the respective noninverted input terminals 5A and 5B.

Further, by constituting differential amplifier pairs or differential pairs by MOS transistors, there can be realized the differential amplifier pairs or the differential pairs having high accuracy without being influenced by fabrication dispersion.

(f) Although according to the second embodiment, the same high reference potential VRH is supplied to the respective voltage shifting circuits 16 and 17, high reference potentials VRHA and VRHB having different potentials may be supplied to the voltage shifting circuits 16 and 17. Thereby, the voltage of the analog signal outputted from the differential amplifier 5 can be set to desired voltage.

(g) Although according to the first and the second embodiments, the differential amplifier 5 is constituted by MOS transistors, the amplifier 5 may be constituted by bipolar transistors.

According to the present invention, by generating the output signal of the analog signal by averaging the plural divided voltages selected in accordance with the digital signals of the D/A conversion apparatus, error of the respective divided voltage caused by the dispersion in the respective elements formed on the semiconductor chip can be averaged and there can be provided the D/A conversion apparatus capable of achieving high accuracy formation of the output voltage of the analog signal.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalent.

What is claimed is:

1. A D/A conversion apparatus comprising:
   divided voltage generating unit for generating divided voltages by dividing voltage of a reference power source;
   selecting signal outputting unit for outputting a selecting signal by decoding inputted digital signals;
   divided voltage selecting unit for selecting and outputting a plurality of the divided voltages in the divided voltages based on the selecting signal; and
   voltage outputting unit for outputting an average value of the plurality of divided voltages outputted from the divided voltage selecting unit.

2. The D/A conversion apparatus according to claim 1:
   wherein the divided voltage generating unit generates the divided voltages by resistor elements.

3. The D/A conversion apparatus according to claim 2:
   wherein the resistor elements include a ladder resistor constituted by a plurality of resistors.

4. The D/A conversion apparatus according to claim 1:
   wherein the voltage outputting unit includes a plurality of differential amplifier circuits supplied with the plurality of the divided voltages and the outputted signal from the voltage outputting unit.

5. The D/A conversion apparatus according to claim 4:
   wherein the differential amplifier circuit includes a plurality of differential amplifier pairs and the differential amplifier pairs are provided with predetermined weighting for distributing the plural divided voltages.

6. The D/A conversion apparatus according to claim 5
   wherein the predetermined weighting averages the plural divided voltages at substantially the same rate.

7. The D/A conversion apparatus according to claim 5:
   wherein the differential amplifier pairs are constituted by MOS transistors.

8. The D/A conversion apparatus according to claim 5:
   wherein the differential amplifier pairs are constituted by bipolar transistors.

9. The D/A conversion apparatus according to claim 1:
   wherein the voltage generating unit generates the divided voltages by capacitor elements.

10. A D/A conversion apparatus comprising:
    divided voltage generating unit for generating a plurality of divided voltages based on inputted digital signals; and
    voltage outputting unit inputted with the plurality divided voltages for outputting an average value of the plurality divided voltages.

11. The D/A conversion apparatus according to claim 10:
    wherein the voltage outputting unit includes a plurality of differential amplifier pair stages supplied with the plurality of the divided voltages and a predetermined voltage.

12. A D/A conversion apparatus comprising:
    divided voltage generating unit for generating divided voltages at a plurality of nodes by dividing voltage of a reference power source;
    selecting signal outputting unit for outputting a selecting signal by decoding inputted digital signals;
    divided voltage selecting unit including a plurality of switches, for selecting and outputting a plurality of the divided voltages in the divided voltages based on the selecting signal, wherein at least one node is coupled to at least two switches; and
    voltage outputting unit for outputting predetermined voltage based on the plurality of divided voltages outputted from the divided voltage selecting unit.

13. The D/A conversion apparatus according to claim 12:
    wherein the voltage outputting unit includes a plurality of differential amplifier pair stages supplied with the plurality of the divided voltages and a predetermined voltage.

14. The D/A conversion apparatus according to claim 12:

wherein the voltage outputting unit includes a plurality of differential amplifier pair stages supplied with the plurality of the divided voltages and a predetermined voltage.

15. The D/A conversion apparatus comprising:

divided voltage generating unit for generating divided voltages at a plurality of nodes by dividing voltage of a reference power source;

selecting signal outputting unit for outputting a selecting signal by decoding inputted digital signals; and divided voltage selecting unit for selecting a plurality of the divided voltages in the divided voltages based on the selecting signal, wherein the divided voltage selecting unit includes a first plurality of switches, which selects and outputs a first divided voltage and a second plurality of switches which selects and outputs a second divided voltage, at least one node is coupled to at least one of the first plurality of switches and at least one of the second plurality of switches; and voltage outputting unit for outputting a predetermined voltage based on the first divided voltage and the second divided voltage.

16. The D/A conversion apparatus according to claim 15, wherein the voltage outputting unit for outputting an average value of the plurality of divided voltages as the predetermined value.

17. The D/A conversion apparatus according to claim 15, wherein the voltage outputting unit includes a plurality of differential amplifier pair stages supplied with the plurality of the divided voltages and a predetermined voltage.

* * * * *